United States Patent
Yuk

(10) Patent No.: US 9,786,337 B2
(45) Date of Patent: Oct. 10, 2017

(54) SENSING BUFFER, PERIPHERAL CIRCUIT, AND/OR MEMORY DEVICE

(71) Applicant: SK hynix Inc., Icheon-si, Gyeonggi-do (KR)

(72) Inventor: Young Sub Yuk, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/259,412

(22) Filed: Sep. 8, 2016

(65) Prior Publication Data
US 2017/0256293 A1 Sep. 7, 2017

(30) Foreign Application Priority Data
Mar. 7, 2016 (KR) .................. 10-2016-0027194

(51) Int. Cl.
| | |
|---|---|
| G11C 7/06 | (2006.01) |
| G11C 7/12 | (2006.01) |
| G11C 7/08 | (2006.01) |
| G11C 7/10 | (2006.01) |
| H03K 3/356 | (2006.01) |
| G11C 16/26 | (2006.01) |
| G11C 11/4091 | (2006.01) |

(52) U.S. Cl.
CPC .............. G11C 7/10 (2013.01); G11C 16/26 (2013.01); H03K 3/356104 (2013.01); *G11C 7/065* (2013.01); *G11C 7/08* (2013.01); *G11C 11/4091* (2013.01); *G11C 2207/002* (2013.01)

(58) Field of Classification Search
CPC ....... G11C 7/065; G11C 11/4091; G11C 7/08; G11C 2207/002

USPC ................ 365/189.17, 189.05, 205
See application file for complete search history.

(56) References Cited

U.S. PATENT DOCUMENTS

| | | | | |
|---|---|---|---|---|
| 5,936,890 A * | 8/1999 | Yeom | .............. | G11C 16/10 365/185.12 |
| 6,434,042 B1 * | 8/2002 | Lee | .............. | G11C 16/08 365/185.12 |
| 8,050,099 B2 * | 11/2011 | Wang | .............. | G11C 5/147 365/185.18 |
| 2003/0214853 A1 * | 11/2003 | Hosono | .............. | G11C 16/3454 365/200 |
| 2006/0133144 A1 * | 6/2006 | Lee | .............. | G11C 16/10 365/185.12 |
| 2008/0080257 A1 * | 4/2008 | Park | .............. | G11C 16/26 365/185.33 |
| 2010/0220535 A1 * | 9/2010 | Kang | .............. | G11C 5/147 365/189.09 |
| 2013/0155780 A1 * | 6/2013 | Park | .............. | G11C 29/24 365/189.05 |
| 2013/0208538 A1 * | 8/2013 | Yang | .............. | G11C 16/28 365/185.2 |
| 2015/0055418 A1 * | 2/2015 | Murakami | .............. | G11C 16/24 365/185.21 |

FOREIGN PATENT DOCUMENTS

KR    1007948350000 B1    1/2008

* cited by examiner

*Primary Examiner* — Ly D Pham
(74) *Attorney, Agent, or Firm* — William Park & Associates Ltd.

(57) ABSTRACT

A sensing buffer, or peripheral circuit or memory device may be provided. The sensing buffer may be configured to maintain a predetermined current according to a first current regardless of an external power supply and/or a temperature.

6 Claims, 9 Drawing Sheets

SENSING BUFFER, PERIPHERAL CIRCUIT, AND/OR MEMORY DEVICE

CROSS-REFERENCE TO RELATED APPLICATION

The present application claims priority under 35 U.S.C. §119(a) to Korean patent application number 10-2016-0027194 filed on Mar. 7, 2016 in the Korean Intellectual Property Office, the entire disclosure of which is incorporated herein by reference.

BACKGROUND

1. Technical Field

Various embodiments of the present disclosure may generally relate to a sensing buffer, peripheral circuit, or memory device, and more particularly to a peripheral circuit or memory device including a sensing buffer.

2. Related Art

A NAND flash memory device may include a memory cell array for storing data, peripheral circuits for performing a program operation, a read operation and a delete operation. The NAND flash memory device may also include a control logic for controlling the peripheral circuit in response to a command.

The memory cell array may include a plurality of planes. Each plane may include a plurality of memory blocks. Each memory block may include a plurality of strings. Each string may include a plurality of memory cells for storing the data.

A peripheral circuit may include a voltage generating circuit, a row decoder, a page buffer unit, a column decoder and an input-output circuit. A voltage generating circuit generates a variety of operating voltages. The row decoder transmits the operating voltage to a selected memory block, among a plurality of memory blocks. The page buffer unit is coupled to the memory cell array via bit lines and temporarily stores the data. The column decoder performs data transfer between the input-output circuit and the page buffer unit. The input-output circuit transmits the data, the command and an address between a controller and the memory device.

The control logic controls the memory device in response to a command received from a host, or transmits data read from the memory device to the host.

DETAILED DESCRIPTION

Figure 1:
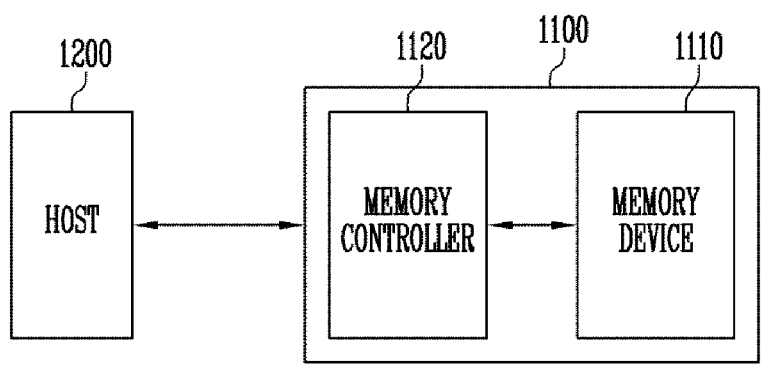
FIG. 1 is a diagram illustrating a representation of an example of a memory system according to an embodiment of the present disclosure.

According to an aspect of the disclosure, there may be provided a sensing buffer. The sensing buffer may include a first input circuit coupled between an external power supply terminal and a ground terminal. The first input circuit may be configured for generating a first current according to a reference voltage. The sensing buffer may include a first mirror circuit configured to maintain a predetermined current of a first node according to the first current regardless of an external power supply and temperature applied to the external power supply terminal or sensing buffer. The sensing buffer may include a second input circuit including a second node, wherein a predetermined current of the second node is based on a sensing voltage and the current of the first node.

According to an aspect of the disclosure, there may be provided a sensing buffer. The sensing buffer may include a first input circuit coupled between an external power supply and a ground voltage and configured for generating a first current in response to a reference voltage. The sensing buffer may include a second input circuit coupled between the external power supply and the ground voltage and configured for generating a second current based on a sensing voltage. The sensing buffer may include a first mirror circuit configured for operating in a saturation state between the first and second input circuits to maintain a predetermined current flowing through a first node and a second node. The sensing buffer may include a second mirror circuit coupled to the ground voltage between the first and second input circuits and configured for generating a current path along with the first mirror circuit. The sensing buffer may include a first boosting circuit coupled between the external power supply and the ground voltage and configured for boosting a current based on a potential of a third node coupled to the first node and a second boosting circuit coupled between the external power supply and the ground voltage and configured for boosting the current based on a potential of a fourth node coupled to the second node.

According to an aspect of the disclosure, there may be provided a memory device including a memory cell array configured for storing data. The memory device may include a page buffer unit coupled to the memory cell array through bit lines and configured for sensing a current or a voltage of the bit lines. The memory device may include a sensing buffer configured for applying a sensing voltage to a gate of switches connecting the page buffer unit with the bit lines and generating the sensing voltage, wherein the switches operate in a saturation state based on a plurality of current paths.

Examples of embodiments will now be described hereinafter with reference to the accompanying drawings. However, the examples of the embodiments may be embodied in different forms and should not be construed as limited to the embodiments set forth herein. Accordingly, the present disclosure is not limited to the following embodiments but embodied in other types. Rather, these embodiments are provided so that the present disclosure will be thorough, and complete, and will fully convey the technical spirit of the disclosure to those skilled in the art.

It will be understood that when an element is referred to as being "coupled" or "coupled" to another element, it can be directly coupled or coupled to the other element or intervening elements may be present therebetween. In the specification, when an element is referred to as "comprising" or "including" a component, it does not preclude another component but may further include other components unless the context clearly indicates otherwise.

FIG. 1 is a diagram illustrating a representation of an example of a memory system according to an embodiment of the present disclosure.

Referring to FIG. 1, a memory system 1100 may include a memory device 1110 for storing data and a memory controller 1120 for controlling the memory device 1110 according to control of a host 1200.

The host 1200 may communicate with the memory system 1100 by using an interface protocol, for example, a peripheral component interconnect-express (PCI-E), an advanced technology attachment (ATA), a serial ATA (SATA), a parallel ATA (PATA), or a serial attached SCSI (SAS). The interface protocol between the host 1200 and the memory system 1100 may not be limited to the above-described example, and may include one of other interface protocols, for example, a universal serial bus (USB), a multi-media card (MMC), an enhanced small disk interface (ESDI), or an integrated drive electronics (IDE).

The memory controller 1120 may control an overall operation of the memory system 1100 and data exchange between the host 1200 and the memory device 1110. For example, the memory controller 1120 may program or read the data by controlling the memory device 1110 according to a request of the host 1200. The memory controller 1120 may select the memory device 1110 to store information of the memory blocks and sub memory blocks included therein, such that a program operation is performed to the memory block and the sub memory blocks according to an amount of data loaded for the program operation. Depending on an embodiment, the memory device 1110 may include a double data rate synchronous dynamic random access memory (DDR SDRAM), a low power double data rate4 (LPDDR4) SDRAM, GDDR (Graphics Double Data Rate) SDRAM, a low power DDR (LPDDR), RDRAM or a flash memory.

The memory device 1110 may perform the program operation, the read operation or the erase operation according to control of the memory controller 1120. When performing a verification operation or a read operation during the program operation and the erase operation, the memory device 1110 may sense a voltage or a current of bit lines according to a threshold voltage of selected memory cells. The memory device 1110 according to an embodiment of the present disclosure may be configured to maintain a predetermined amount of current flowing through the bit lines during a sensing operation.

Figure 2:
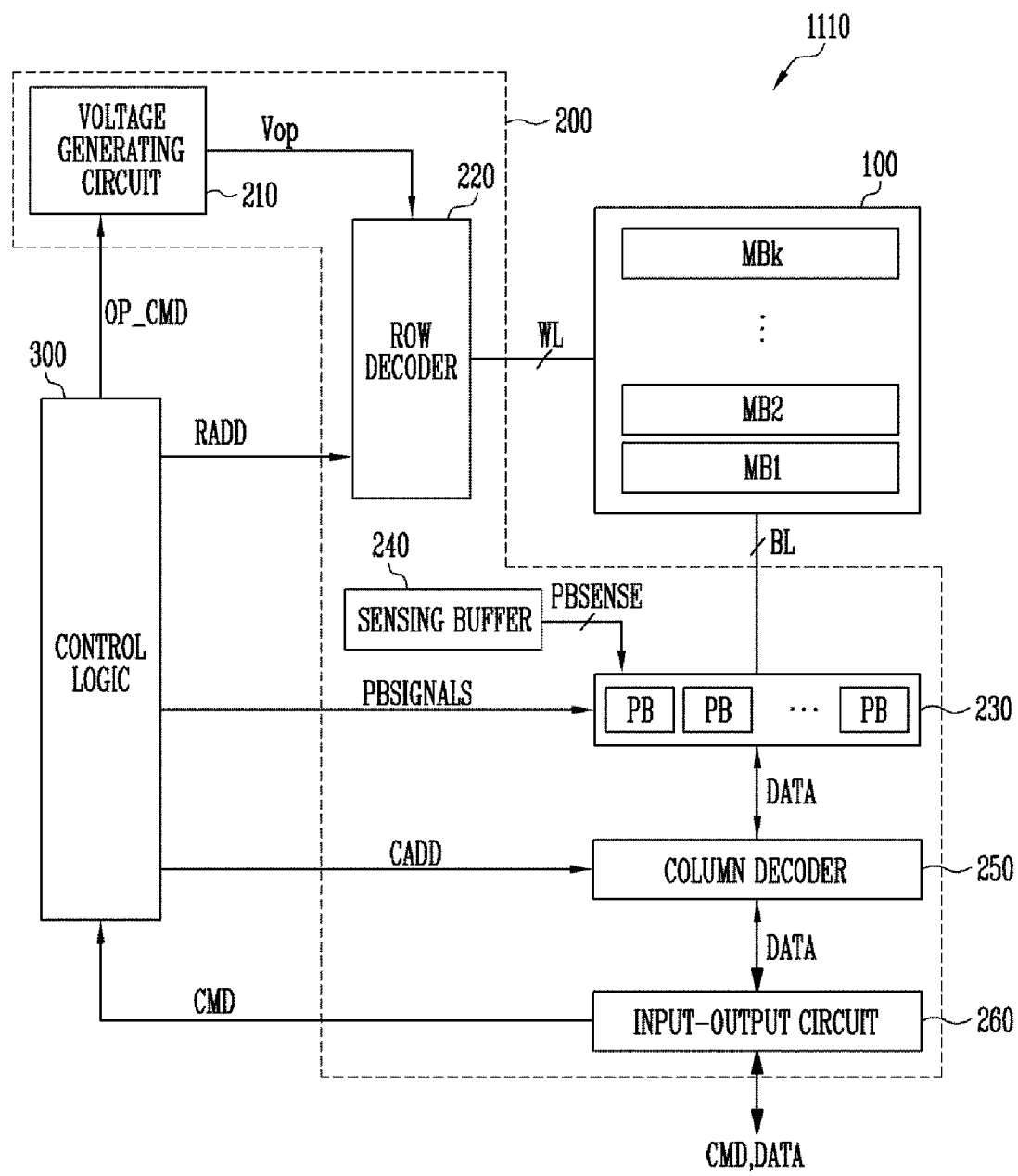
FIG. 2 is a diagram illustrating a representation of an example of a memory device.

FIG. 2 is a diagram illustrating a representation of an example of a memory device.

Referring to FIG. 2, the memory device 1110 may include the memory cell array 100, peripheral circuits 200 configured to program data in the memory cell array 100, read stored data or erase the data, and a control logic 300 for controlling the peripheral circuits 200.

The memory cell array 100 may include a plurality of memory blocks MB1 to MBk (k is a positive integer). The memory blocks MB1 to MBk may include a plurality of strings. The strings may include a plurality of memory cells. The strings may be coupled to bit lines BL, the memory cells may be coupled to the word lines WL. A group of memory cells coupled to the same word line may be referred to as a page. The memory blocks MB1 to MBk may be implemented in a two-dimensional or a three-dimensional structure in accordance with a memory cell arrangement structure. For example, in the memory blocks MB1 to MBk having the two-dimensional structure, the memory cells may be arranged in a horizontal direction to a substrate. In the memory blocks MB1 to MBk having the three-dimensional structure, the memory cells may be stacked in a direction perpendicular to the substrate.

The peripheral circuits 200 may include a voltage generating circuit 210, a row decoder 220, a page buffer unit 230, a sensing buffer 240, a column decoder 250 and an input-output circuit 260.

The voltage generating circuit 210 may generate operating voltages Vop at various levels for the program operation, the read operation and the erase operation in response to an operating signal OP_CMD. When the program operation is designated as an example, the voltage generating circuit 210 may generate program voltages, pass voltages and verification voltages at the various levels.

The row decoder 220 may transfer the operating voltages Vop to the selected memory block in response to a row address RADD.

The page buffer 230 may include a plurality page buffers PB1, PB2, . . . , and PBi (i is a positive integer) coupled to the bit lines BL. The page buffer unit 230 may temporarily store the data during the program operation or the read operation and perform the sensing operation of the memory cells included in a selected page during the read operation, a program verification operation and an erase verification operation.

The sensing buffer 240 may generate a sensing voltage PBSENSE to maintain a predetermined amount of a current of the bit lines BL when the page buffer unit 240 performs the sensing operation. For example, the sensing buffer 240 may maintain a predetermined sensing voltage PBSENSE by comparing the sensing voltage PBSENSE to a reference voltage. The sensing of the buffer 240 will be described later with reference to FIG. 7.

The column decoder 250 may perform data (DATA) transfer between the input-output circuit 260 and the page buffer 230 in response to a column address CADD.

The input-output circuit 260 may transmit a command CMD received from the memory controller (1120 of FIG. 1) to the control logic 300, transmit data DATA received from the memory controller (1120 of FIG. 1) to the column decoder 250, or transmit the data DATA received from the column decoder to the memory controller (1120 of FIG. 1). Although not illustrated in the drawings, the input-output circuitry 260 may transmit the address received from the memory controller (1120 in FIG. 1) to the control logic 300.

The control logic 300 may control the peripheral circuits 200 by outputting an operation signal (OP_CMD), the row address (RADD), a page buffer control signal (PBSIGNALS) in response to the command (CMD) and the address.

Figure 3:
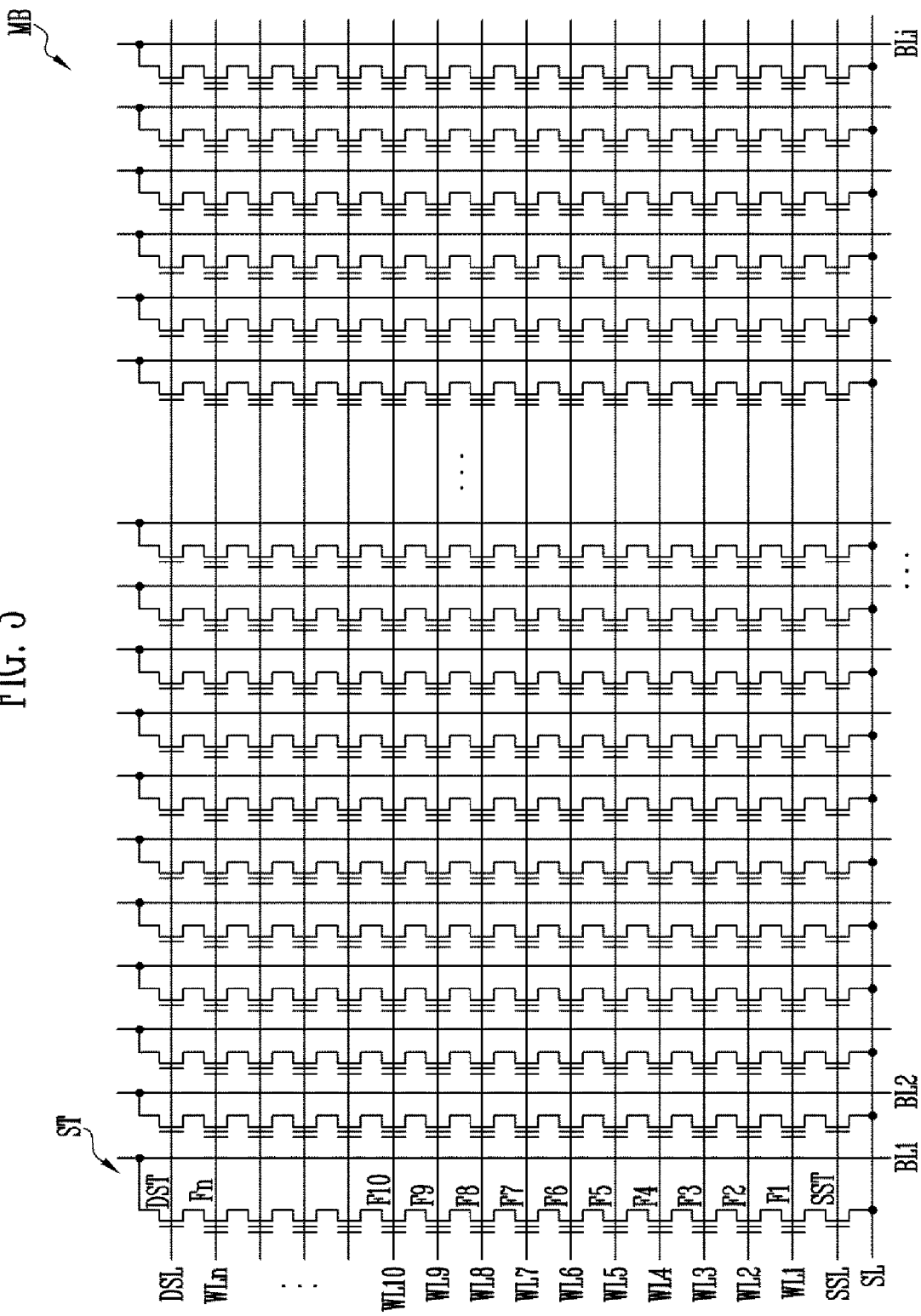
FIG. 3 is a diagram illustrating a representation of an example of a memory block.

FIG. 3 is a diagram illustrating a representation of an example of a memory block.

Referring to FIG. 3, a memory block MB may include a plurality of strings ST coupled between the bit lines BL1 to BLi (i is a positive integer) and a source line SL. The bit lines BL1 to BLi may be coupled to the strings ST, respectively, and the source line SL may be commonly coupled to the strings ST. Since the strings ST are subject to the same configurations as each other, an example of a string ST coupled to a first bit line BL1 will be described as follows.

An example of a string ST may include a source select transistor SST coupled in series between the source line SL and the first bit line BL1, a plurality of memory cells F1 to Fn (n is a positive integer), and a drain select transistor DST. A source of the source select transistor SST may be coupled to the source line SL, a drain of the drain select transistor DST may be coupled to the first bit line BL1, and the memory cells F1 to F16 may be coupled between the source select transistor SST and the drain select transistor DST. Gates of the source select transistors SST included in different strings ST may be coupled to the source select line SSL, gates of the drain select transistors DST included in different strings ST may be coupled to the drain select line DSL, gates of the memory cells F1 to Fin included in different strings ST may be coupled to word lines WL1 to WLn, respectively. The number of the source select transistor SST, the drain select transistor DST and the memory cells F1 to Fn included in one string ST may vary depending on the memory device.

Figure 4:
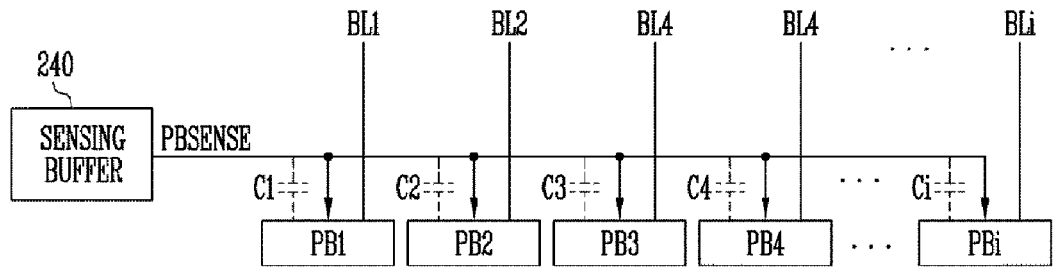
FIG. 4 is a diagram illustrating a representation of an example of a connecting relation between page buffers and a sensing buffer.
Figure 5:
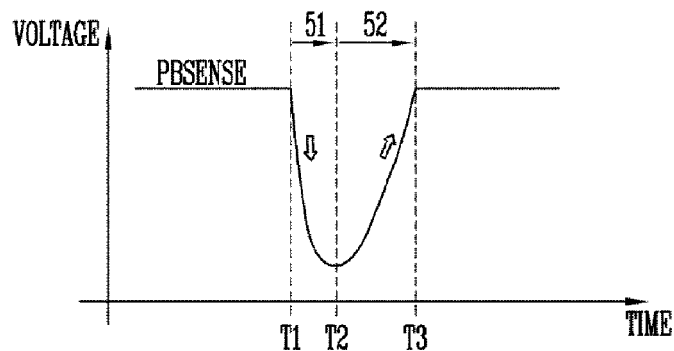
FIG. 5 is a diagram illustrating a representation of an example of the change of a sensing voltage during a sensing operation.

FIG. 4 is a diagram illustrating a representation of an example of a connecting relation between a page buffer and a sensing buffer, and FIG. 5 is a diagram illustrating a representation of an example of the change of a sensing voltage during a sensing operation.

Referring to FIG. 4, the page buffers PB1 to PBi (i is a positive integer) may be coupled to bit lines BL1 to BLi, respectively. During the sensing operation, the page buffers PB1 to PBi may sense an electric potential of the bit lines BL1 to BLi in response to the sensing voltage PBSENSE. The sensing voltage PBSENSE may be generated in the sensing buffer 240. For example, the sensing voltage PBSENSE generated in the sensing buffer 240 may be commonly applied to the page buffers PB1 to PBi. The sensing voltage PBSENSE may be generated in one sensing buffer 240 and applied to a plurality of page buffers PB1 to PBi. Therefore, when capacitances C1 to Ci between lines to which the sensing voltage PBSENSE is applied and the page buffers PB1 to PBi are variable, the sensing voltage PBSENSE may become variable. During the sensing operation, when the sensing voltage PBSENSE is variable, an amount of current of the bit lines BL is variable. Accordingly, reliability of the sensing operation may be reduced. A sensing voltage PBSENSE that is variable will be described with reference to FIG. 5.

Referring to FIG. 5, the sensing operation may be simultaneously performed at the same time because in the plurality of memory cells, the amount of current passing through the bit lines may instantaneously increase at time point T1. When the amount of current flowing through the bit lines instantaneously increases, voltages of a part of nodes of the page buffers coupled to the bit line may be instantaneously lowered. Due to a change of the capacitance of the page buffers, the sensing voltage PBSENSE may be instantaneously lowered at section 51 between time points T1 and T2. When the sensing voltage PBSENSE is lowered, the sensing the buffer (240 in FIG. 4) may increase a level of the sensing voltage PBSENSE in comparison with the sensing voltage PBSENSE and the reference voltage. A connecting relation between the page buffer and the sensing buffer will be described with reference to FIG. 6. In an embodiment, the sensing voltage PBSENSE may raise (as indicated by the arrow) at section 52 between time points T2 and T3.

Figure 6:
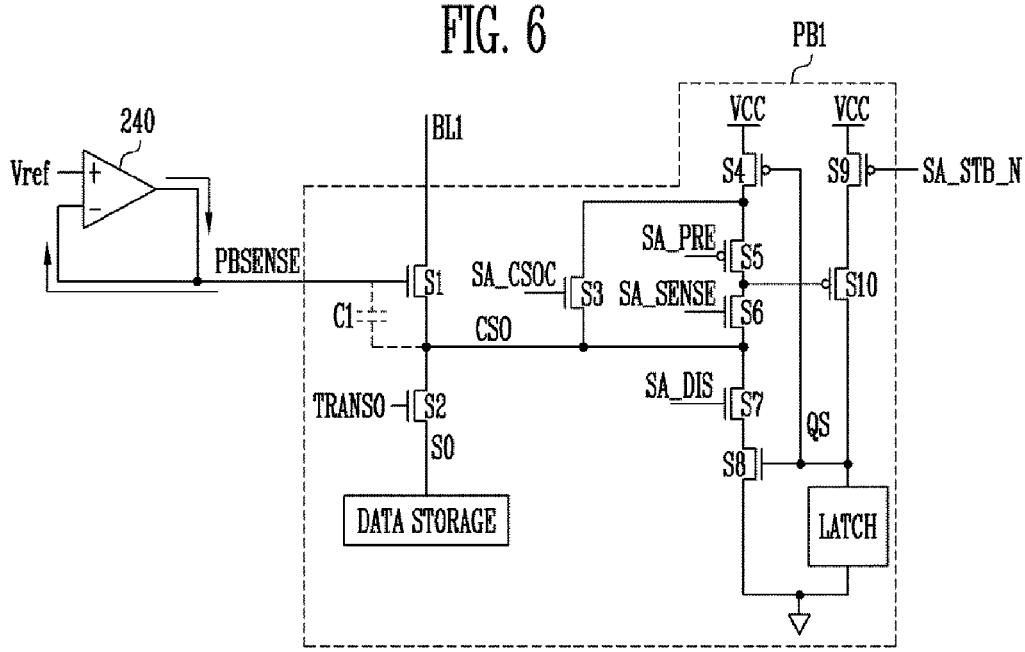
FIG. 6 is a diagram illustrating a representation of an example of a connecting relation between a page buffer unit and a sensing buffer.

FIG. 6 is a view for explaining a representation of an example of the connection relationship between the page buffer and the sense buffer in FIG. 4.

Referring to FIG. 6, a partial circuit coupled to a page buffer PB1 and the sensing buffer 240 may be illustrated. Although not illustrated in FIG. 6, the page buffer PB1 may include a plurality of laches, data storage units and switches in addition to the circuits illustrated in FIG. 6.

The page buffer PB1 may include switches S1 to S10. A first switch S1 may be implemented as an NMOS transistor that connects the bit line BL1 to a current sensing node CSO in response to the sensing voltage PBSENSE. An amount of current passing through the first switch S1 may be controlled in accordance with a level of the sensing voltage PBSENSE. Therefore, when the sensing voltage PBSENSE is predetermined, an amount of current flowing through a second switch may be predetermined, thereby reducing a variation of an amount of current variation flowing through the bit line BL1 and the current sensing node CSO.

A second switch S2 may be implemented as an NMOS transistor that connects the current sensing node CSO to a sensing node SO in response to a transmission signal TRANSO. The sensing node SO may be coupled to the data storage DATA STORAGE. A third switch S3 may be implemented as an NMOS transistor that connects a node connecting a fourth switch S4 and a fifth switch S5 to the current sensing node CSO in response to a pre-charge transmission signal SA_CSOC. The fourth switch S4 may be implemented as a PMOS transistor that connects a power supply VCC terminal to the fifth switch S5 in response to data QS stored in a latch. The fifth switch S5 may be may be implemented as an PMOS transistor that connects and transmits a power voltage received from the fourth switch S4 to a sixth switch S6 in response to a pre-charge signal SA_PRE. The sixth switch S6 may be implemented as an NMOS transistor that connects the fifth switch S5 and the current sensing node CSO in response to a sensing transmission signal SA_SENSE. A seventh switch S7 may be implemented as an NMOS transistor that connects the current sensing node CSO to an eighth switch S8 in response to a discharge signal SA_DIS. The eighth switch S8 may be implemented as an NMOS transistor that connects the seventh switch S7 and a ground terminal in response to the data QS stored in the latch. A ninth switch S9 may be implemented as a PMOS transistor that connects the power supply terminal VCC to a tenth switch S10 in response to a strobe signal SA_STB_N. The tenth switch S10 may be implemented as a PMOS transistor that connects the ninth switch S9 to the latch in response to a potential of a node connecting the fifth and sixth switches to each other.

The sensing buffer 240 may initialize the sensing voltage PBSENSE in response to a reference voltage Vref, and after initializing the sensing voltage PBSENSE, a level of the sensing voltage PBSENSE may be adjusted in comparison with a feedbacked sensing voltage PBSENSE and the reference voltage Vref.

Before performing a sensing operation of the page buffer PB1, a pre-charging operation may be performed to pre-charge the bit line BL1 to a positive voltage. During the pre-charge operation, data stored in the latch QS may be initialized to 0 (zero). Data '0' may indicate that a potential of a node in a latch is in a low state. Thus, when the data stored in the latch QS is 0 (zero), the fourth switch S4 may be turned on. When the third switch S3 and the first switch S1 are turned on, a current path through the fourth, third and first switches S4, S3 and S1 may be generated. Therefore, the bit lines BL1 and the supply power terminal VCC may be coupled to each other and the bit line BL1 may be pre-charged to the positive voltage. A method of pre-charging a bit line BL2 may be performed in various types in addition to the above described method. After the bit line BL1 is pre-charged, the third and fifth switches S3 and S5 may be turned off, such that power supply for a pre-charging voltage to the current sensing node CSO may be stopped. When the verification voltage of the read voltage is applied to a selected page, the potential of the bit line BL1 may be maintained at a pre-charged level or lowered according to a threshold voltage of a memory cell included in the selected page. Subsequently, the sensing operation for sensing the potential of the bit line BL1 may be performed.

During the sensing operation, since the first and sixth switches S1 and S6 are turned on, the tenth switch S10 may be turned on or off depending on the potential of the current sensing node CSO. Subsequently, when the ninth switch S9 is turned on, the data QS stored in the latch may maintain or change previous data according to whether or not the tenth switch S10 is turned on.

In the above description, one page buffer PB1 is described as an example, but a plurality of page buffers (PB1 to PBi in FIG. 4) may be substantially included in the memory device. When the plurality of page buffers PB1 to PBi concurrently operate, currents of the bit lines and current sensing nodes are temporarily variable, the sensing voltage PBSENSE may be variable due to the capacitance change of the current sensing nodes in the plurality of page buffers. However, according to an embodiment, a sensing buffer 240 for maintaining a predetermined sensing voltage PBSENSE may be provided. The sensing buffer 240 will be described as follows.

Figure 7:
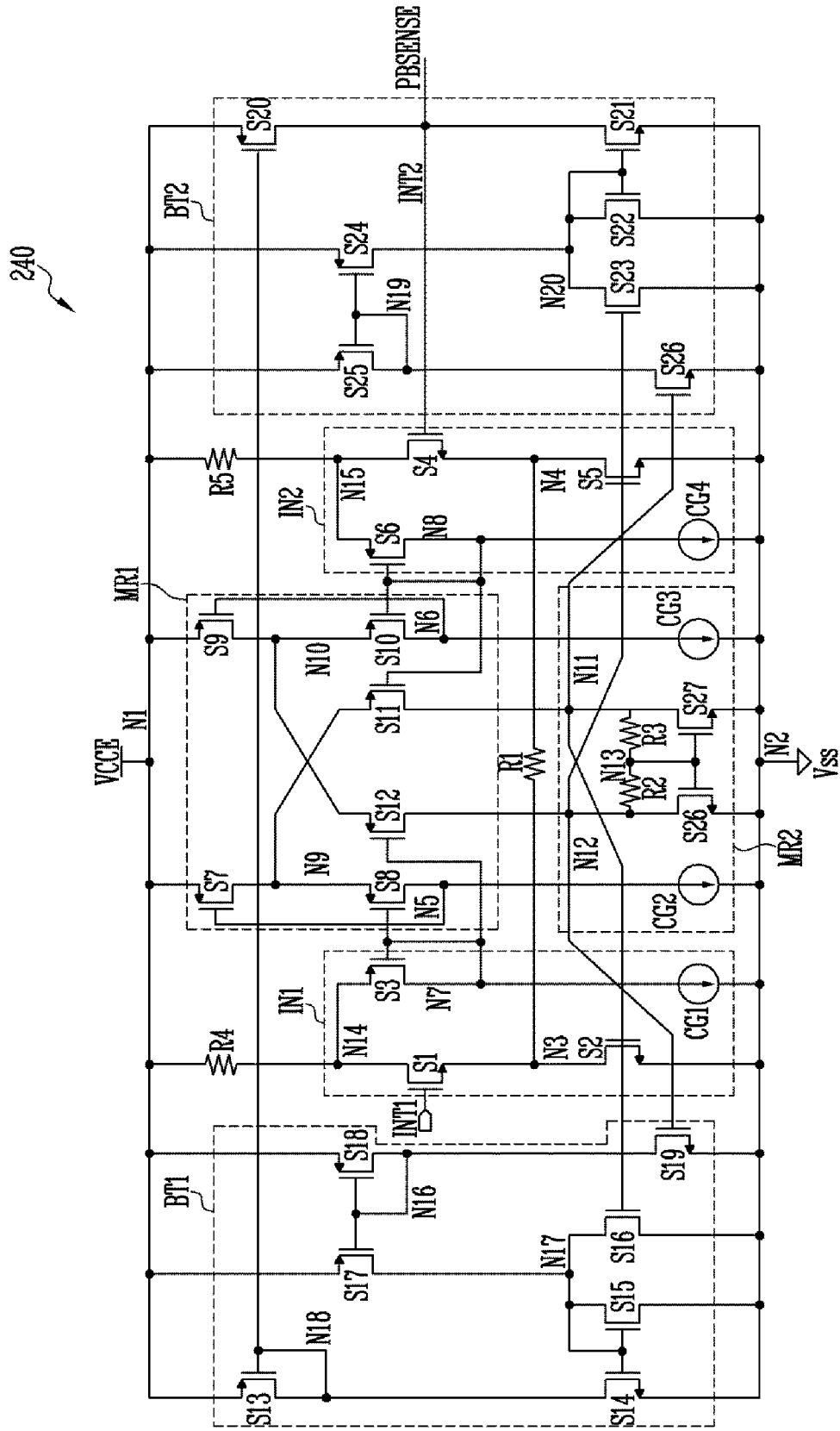
FIG. 7 is a circuit diagram illustrating a representation of an example of a sensing buffer of FIG. 6.

FIG. 7 is a circuit diagram illustrating a representation of an example of a sensing buffer of FIG. 6.

Referring to FIG. 7, the sensing buffer 240 may include the first input circuit IN1, the second input circuit IN2, the first mirror circuit MR1, the second mirror circuit MR2, a first boosting circuit BT1, and a second bossing circuit BT2 coupled between a first node N1 coupled to the external power supply VCCE terminal and a second node N2 coupled to a ground voltage VSS terminal.

The first input circuit IN1 may be configured to be applied with the reference voltage. The second input circuit IN2 may be configured to be applied with the sensing voltage PBSENSE. The first and second mirror circuits MR1 and MR2 may be configured to maintain a predetermined amount of current in the sensing buffer 240. The first and second boosting circuits BT1 and BT2 may be configured to increase the amount of current for sensing with the internal buffer 240.

Subsequently, each circuit IN1, IN2, MR1, MR2, BT1 and BT2 will be described. However, terms of devices included in each circuit IN1, IN2, MR1, MR2, BT1 and BT2 have been granted to distinguish between the devices and are not related to an order of operation.

The first input circuit IN1 may be coupled between the external power supply VCCE terminal and the ground voltage VSS terminal and may include the first to third switches S1 to S3 and a first current generator CG1. The first switch S1 may be coupled between a fourteenth node N14 and a third node N3, and may be implemented as the NMOS transistor that is to be turned on or off in response to the reference voltage applied through the first input terminal INT1. The second switch S2 may be coupled between the third node N3 and the second node N2 and implemented as the NMOS transistor that is to be turned on or off in response to a potential of an eleventh node N11. The third switch S3 may be implemented as a diode coupled between the fourteenth node N14 and a seventh node N7. For example, the third switch S3 may be implemented as the PMOS transistor to be turned on or tuned off in response to a potential of the seventh node N7. A fourth resistance R4 may be coupled between the fourteenth node N14 and the first node N1.

The second input circuit IN2 may be coupled in parallel with the first input circuit IN1 between the external power supply VCCE terminal and the ground voltage VSS terminal, and include the fourth to sixth switches S4 to S6 and a fourth current generator CG4. The fourth switch S4 may be coupled between a fifteenth node N15 and a fourth node N4 and implemented as the NMOS transistor that is turned on or off in response to the sensing voltage PBSENSE applied through the second input terminal INT2. The fifth switch S5 may be coupled between the fourth node N4 and the second node N2 and implemented as the NMOS transistor in response to a potential of a twelfth node N12. The sixth switch S6 may be implemented by a diode coupled between the fifteenth node N15 and an eighteenth node N8. For example, the sixth switch S6 may be implemented as the PMOS transistor that is to be turned on or off in response to a potential of the eighth node N8. The fourth current generator CG4 may be coupled between the eighth node N8 and the second node N2 and may generate the current to an eighth node N8. A fifth resistor R5 may be coupled to between the fifteenth node N15 and the first node N1.

A first resistor R1 may be coupled between the third node N3 of the first input circuit IN1 and the fourth node N4 of the second input circuit IN2, a compensation current path which flows in a direction from the first input circuit IN1 to the second input circuit IN2 may be generated.

The first mirror circuit MR1 may be coupled between the first and second input circuits IN1 and IN2 and configured to operate in a saturation state when supplied with power supply from the external power supply VCCE terminal. The first mirror circuit MR1 may include the seventh to twelfth switches S7 to S12. The seventh switch S7 may be coupled between the first node N1 and a ninth node N9 and implemented as the PMOS transistor that is to be turned on or off in response to the potential of a fifth node N5. The eighth switch S8 may be coupled between the ninth node N9 and the fifth node N5 and implemented as the PMOS transistor that is to be turned on or off in response to the seventh node N7. The ninth switch S9 may be coupled between the first node N1 and a tenth node N10 and implemented as the PMOS transistor that is to be turned on or off in response to a potential of a sixth node N6. The tenth switch S10 may be coupled between the tenth node N10 and the sixth node N6 and implemented as the PMOS transistor that is to be turned on or off in response to a potential of the eighth node N8. An eleventh switch S11 may be coupled between the ninth node N9 and the eleventh node N11 and implemented as the PMOS transistor that is to be turned on or off in response to the potential of the eighth node N8. The twelfth switch S12 may be coupled between the tenth node N10 and the twelfth node N12 and implemented as the PMOS transistor that is to be turned on or off in response to a potential of the seventh node N7.

For the sake of current mirroring, the seventh and ninth switches S7 and S9 may be implemented as PMOS transistors of the same size with each other, the eighth and tenth switches S8 and S10 also may be implemented as PMOS transistor of the same size as each other, and the eleventh and twelfth switches S11 and S12 may be implemented as PMOS transistors with the same size as each other.

The second mirror circuit MR2 may be coupled to the ground voltage VSS terminal between the first and second input circuits IN1 and IN2 and form a current path along with the first mirror circuit MR1. The second mirror circuit MR2 may include a twenty sixth switch S26, a twenty seventh switch S27, a second resistor R2, a third resistor R3, a second current generator CG2 and a third current generator CG3. The twenty sixth switch S26 may be coupled between the twelfth node N12 and the second node N2 and implemented as the NMOS transistor that is to be turned on or off in response to a potential of a thirteenth node N13. The twenty seventh switch S27 may be coupled between the eleventh node N11 and the second node N2 and implemented as the NMOS transistor that is to be turned on or off in response to the potential of the thirteenth node N13. The second resistor R2 and the third resistor R3 may be coupled to each other through the thirteenth node N13, and coupled with each other in series between the twelfth node N12 and the eleventh node N11. The second current generator CG2 may be coupled between the fifth node N5 and the second node N2 and may generate the current to the fifth node N5. The third current generator CG3 may be coupled between the sixth node N6 and the second node N2 to generate the current to the sixth node N6.

The first boosting circuit BT1 may be coupled to the first input circuit IN1 and boost the internal current of the sensing buffer 240. The first boosting circuit BT1 may include a thirteenth switch to a nineteenth switch S13 to S19. The thirteenth switch S13 may be implemented as a diode coupled between the first node N1 and the eighteenth node N18. For example, the thirteenth switch S13 may be implemented as the PMOS transistor that is to be turned on or off in response to the potential of the eighteenth node 18. A fourteenth switch S14 may be coupled between the eighteenth node N18 and the second node N2 and implemented as NMOS transistor that is to be turned on or off in response to a potential of a seventeenth node N17. A fifteenth switch S15 may be coupled between the seventeenth node N17 and the second node N2 and implemented as the NMOS transistor that is to be turned on or off in response to the potential of the seventeenth node N17. A sixteenth switch S16 may be coupled between the seventeenth node N17 and the second node N2 and implemented as the NMOS transistor that is to be turned on or off in response to a potential of the eleventh node N11. A seventeenth switch S17 may be coupled between the first node N1 and the seventeenth node N17 and implemented as the PMOS transistor that is to be turned on or off in response to a potential of a sixteenth node N16. An eighteenth switch S18 may be coupled between the first node N1 and the sixteenth N16 and implemented as the NMOS transistor that is to be turned on or off in response to the potential of the sixteenth node N16. The nineteenth switch S19 may be coupled between the sixteenth node N16 and the second node N2 and implemented as the NMOS transistor that is to be turned on or off in response to the potential of the twelfth node N12.

In the first boosting circuit BT1, when the nineteenth switch S19 is designated as a first current, the fifteenth switch S15 is designated as a second current and the fourteenth switch S14 is designated as a third current, by a structure of the first boosting circuit BT1, the second current may be larger than the first current and the third current may be larger than the second current.

The second boosting circuit BT2 may be coupled to the second input circuit IN2, boost the current, and output the sensing voltage PBSENSE. The second boosting circuit BT2 may include twentieth to twenty sixth switches S20 to S26. The twentieth switch S20 may be coupled between the first node N1 and the second input terminal INT2 and implemented as the NMOS transistor that is to be turned on or off in response to the potential of the eighteenth node N18. A twenty first switch S21 may be coupled between the second input terminal INT2 and the second node N2 and implemented as the NMOS transistor that is to be turned on or off in response to a potential of a twentieth node N20. A twenty second switch S22 may be coupled between the twentieth node N20 and the second node N2 and implemented as the NMOS transistor that is to be turned on or off in response to the potential of the twentieth node N20. A twenty third switch S23 may be may be coupled between the twentieth node N20 and the second node N2 and implemented as the NMOS transistor that is to be turned on or off in response to the potential of the twelfth node N12. A twenty fourth switch S24 may be coupled between the first node N1 and the twentieth node N20 and implemented as the NMOS transistor that is to be turned on or off in response to a potential of a nineteenth node N19. A twenty fifth switch S25 may be coupled between the first node N1 and the nineteenth node N19 and implemented as the NMOS transistor that is to be turned on or off in response to the potential of the nineteenth node N19. The twenty sixth switch S26 may be coupled between the nineteenth node N19 and the second node N2 and implemented as the NMOS transistor that is to be turned on or off in response to the potential of the eleventh node N11.

In a phase of configuration of the second boosting circuit BT2, the first current may flow through the twenty sixth switch S26, the second current may flow through the twenty second switch S22, and the third current may flow through the twenty first switch S21. The second current may be larger than the first current, and the third current may be larger than the second current. Operation of the sensing buffer 240 described above will be described in FIG. 8.

Figure 8:
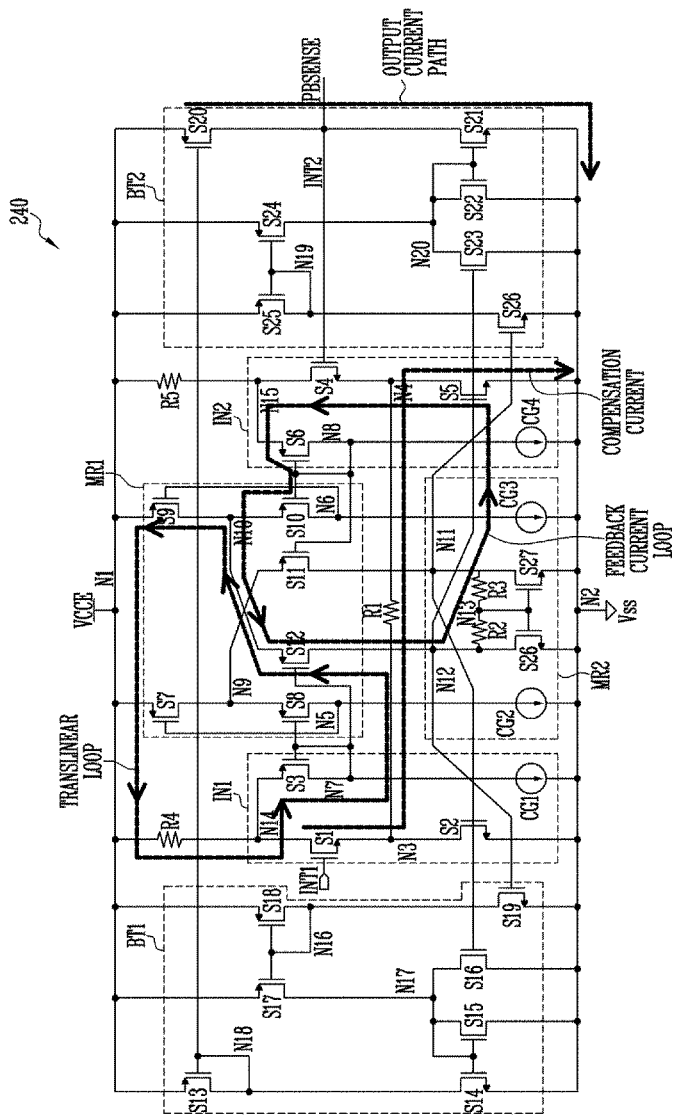
FIG. 8 is a circuit diagram illustrating a representation of an example of an operation of a sensing buffer of FIG. 7.

FIG. 8 is a circuit diagram illustrating a representation of an example of an operation of a sensing buffer of FIG. 7.

Referring to FIG. 8, by the first to fourth current generators CG1 to CG4, potentials of the seventh, fifth, sixth and eighth nodes N7, N5, N6 and N8 may become a low state. Accordingly, during the sensing operation, the third, eighth, twelfth, sixth, tenth, eleventh, seventh, and ninth switches S3, S8, S12, S6, S10, S11, S7, and S9 in which gates coupled to at least one of the seventh, fifth, sixth and eighth nodes N7, N5, N6 and N8 may be turned on. That is, by the first to fourth current generators CG1 to CG4, the third, eighth, twelfth, sixth, tenth, eleventh, seventh, and ninth switches S3, S8, S12, S6, S10, S11, S7, and S9 may be turned on.

Since the seventh and eleventh switches S7 and S11 are turned on, the potential of the eleventh node N11 may become a high state. Accordingly, the second, sixteenth and twenty sixth switches S2, S16 and S26 may be turned on. In addition, since the ninth and twelfth switches S9 and S12 are turned on, the potential of the twelfth node N12 may become a high state. Accordingly, the nineteenth, fifth and twenty third switches S19, S5 and S23 may be turned on.

When the reference voltage of the positive voltage is applied to the first input terminal INT1, the first switch S1 may be turned on. Accordingly, the current path may be formed through the fourteenth node N14, the third node N3, the first resistor R1 and the fourth node N4.

When the nineteenth switch S19 is turned on in the first boosting circuit BT1, the potential of the sixteenth node N16 may become a low state and the seventeenth and eighteenth switches S17 and S18 may be turned on accordingly. When the seventeenth switch S17 is turned on, the potential of the seventeenth node N17 may become a high state, and the fourteenth and fifteenth switches S14 and S15 may be turned on accordingly. When the fourteenth switch S14 is turned on, the eighteenth switch node N18 may become a low state and the thirteenth switch S13 may be turned on accordingly. Thus, in the first boosting circuit BT1, a current path which flows in a direction from the eighteenth switch S18 to the nineteenth switch S19 may be formed, a current path which flows in a direction from the seventeenth switch S17 to the fifteenth switch S15 may be formed, and a current path which flows in a direction from the thirteenth switch S13 to the fourteenth switch S14 may be formed. Thus, current in the first boosting circuit BT1 may be the boosted through the sixteenth node N16, the seventeenth node N17 and the eighteenth node N18.

When the twenty sixth switch S26 is turned on in the second boosting circuit BT2, the potential of the nineteenth node N19 becomes a low state, and the twenty fifth and twenty fourth switches S25 and S24 may be turned on accordingly. When the twenty fourth switch S24 is turned on, the potential of the twentieth node N20 becomes a high state, and the twenty second and twenty first switches S22 and S21 may be turned on accordingly. Thus, a current path flowing in a direction from the twenty fifth switch S25 to the twenty sixth switch S26 may be formed, a current path flowing in a direction from the twenty fourth switch S24 to the twenty second switch S22 may be formed and a current path flowing in a direction from the twentieth switch S20 to the twenty first switch S21 may be formed in the second boosting circuit BT2. Accordingly, the current in the first boosting circuit BT1 may be boosted through the sixteenth node N16, the seventeenth node N17 and the eighteenth node N18. Since the twentieth and twenty first switches S20 and S21 are turned on, and the current path is formed, the current may flow through the second input terminal INT2 and the sensing voltage PBSENSE may be generated. When the sensing voltage PBSENSE is generated, the fourth switch S4 may be turned on, such that the current path may be formed through the fifth node N5 and the fourth node N4.

When the reference voltage is applied to the first input terminal INT1 and the sensing voltage PBSENSE is applied to the second input terminal INT2, a second current may flow through the fourteenth node N14, the first switch S1, the third switch S3, the first resistor R1, the fourth node N4, the fifth switch S5 and the second node N2.

A translinear loop may be formed through the first node N1, a fourth resistor R4, the fourth node N4, the third switch S3, the seventh node N7, the twelfth switch S12, the tenth node N10 and the nineteenth switch S9. Through the current flowing through the translinear loop, a sum of internal voltage of the first mirror circuit MR1 may be in a lower state than an external power supply even though the temperature or the external power supply is lowered.

A feedback current loop may be generated through the tenth node N10, the twelfth switch S12, the twelfth node N12, the fifth switch S5, the fourth node N4, the fourth switch S4, the fifteenth node N15, the sixth switch S6, the eighth node N8 and the tenth switch S10 by the translinear loop. The twelfth switch S12, the fifth switch S5, the fourth switch S4, the sixth switch S6 and the tenth switch S10 included in the feedback current loop may operate in a saturation state by the translinear loop. Therefore, a predetermined voltage gain and a predetermined current gain are maintained in the sensing buffer 240.

As described above, a predetermined internal current of the sensing buffer 240 may be maintained by the compensation current, the translinear loop and the feedback current loop. Accordingly, during the sensing operation of the page buffers (PB1 to PBi of FIG. 4), even though the capacitance is instantaneous changed, a predetermined current of the second input terminal INT2 may be maintained. Since the current may be recovered at a normal level even though the current of the second input terminal INT2 is rapidly changed, the sensing voltage PBSENSE may be reliably produced.

Figure 9:
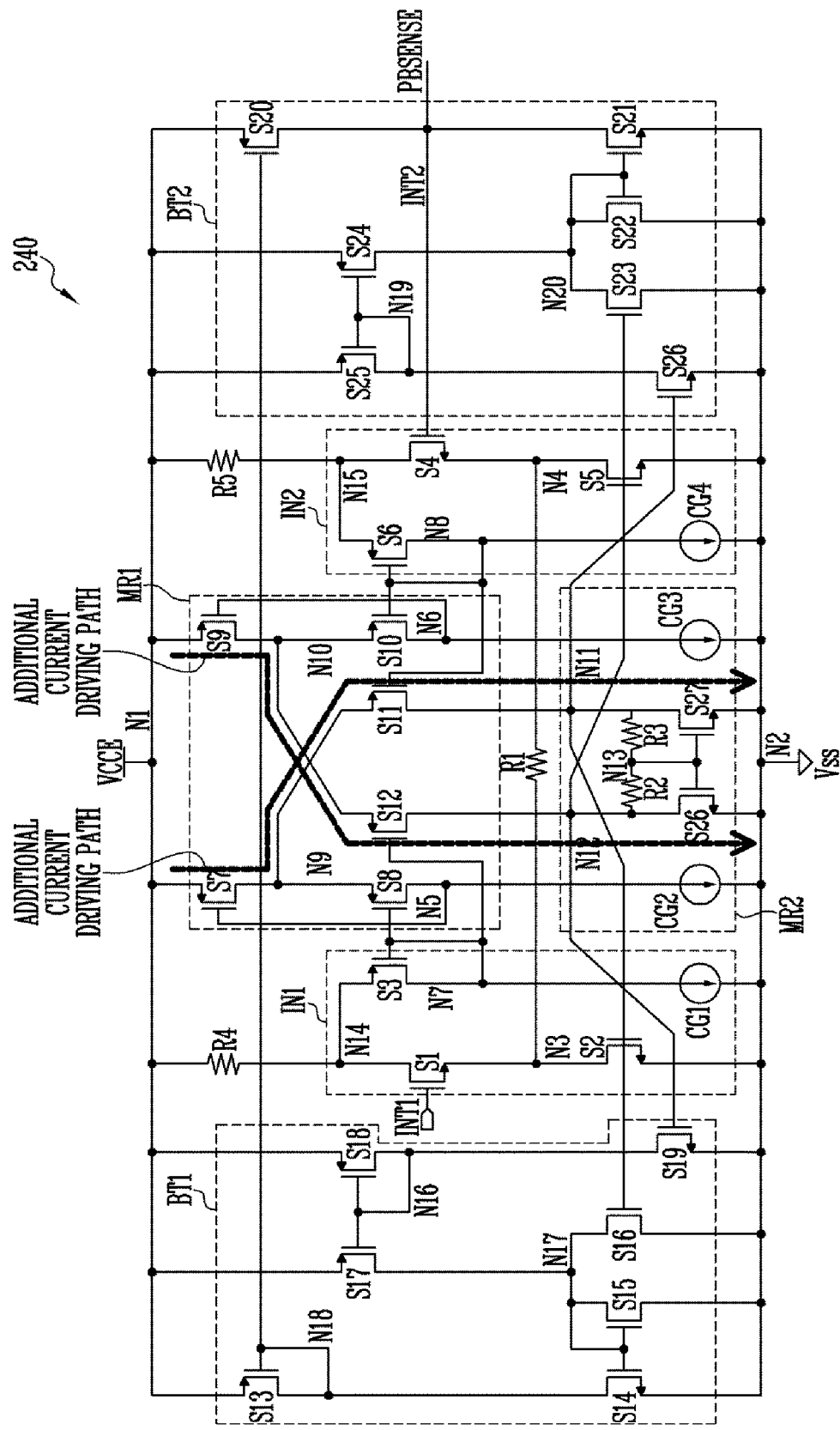
FIG. 9 is a circuit diagram illustrating a representation of an example of a feature of a sensing buffer of FIG. 7.

FIG. 9 is a circuit diagram illustrating a representation of an example of a function of a sensing buffer in FIG. 7.

With further reference to FIG. 9, in addition to the compensation current, the translinear loop and the feedback current loop described in FIG. 8, a slew current of the sensing buffer 240 may be rapidly driven through an additional current driving path of the seventh switch S7, the ninth node N9, the eleventh switch S11, the eleventh node N11, the twenty seventh switch S27 and the second node N2 and an additional current driving path of the ninth switch S9, the tenth node N10, the twelfth switch S12, the twelfth node N12, the twenty sixth switch S26 and the second node N2.

Figure 10:
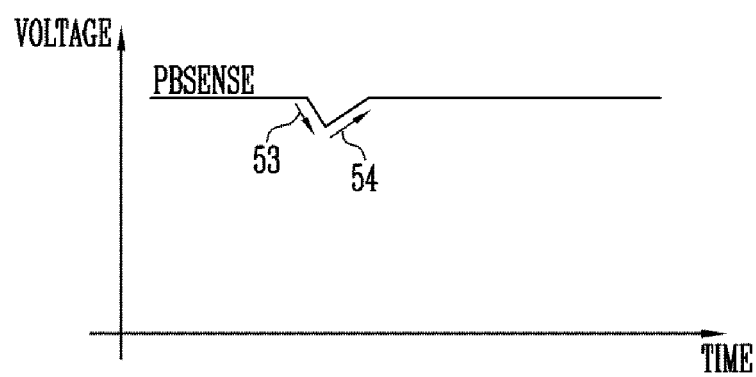
FIG. 10 is a diagram illustrating a representation of an example of an effect according to an embodiment of the present disclosure.

FIG. 10 is a diagram illustrating a representation of an example of an effect according to an embodiment of the present disclosure.

Referring to FIG. 10, as described in FIGS. 8 and 9, the sensing voltage PBSENSE may be quickly stabilized 54 by the sensing buffer even though the sensing voltage PBSENSE is instantly unstable 53 due to a capacitance change between the temperature, the external power supply or the page buffers while a predetermined sensing voltage PBSENSE is generated.

Figure 11:
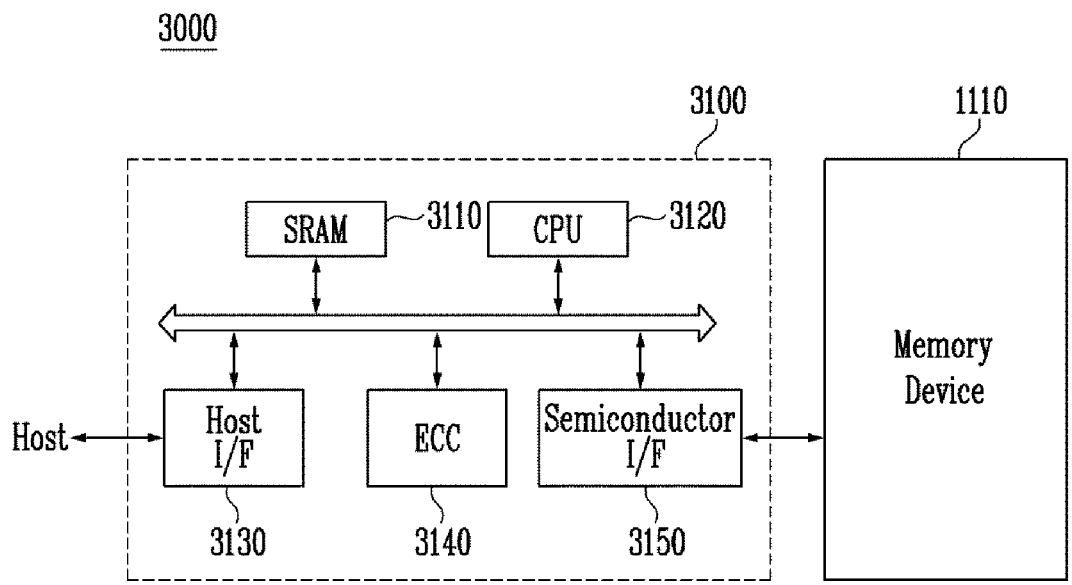
FIG. 11 is a diagram illustrating a representation of an example of a memory system including a memory device according to an embodiment.

FIG. 11 is a diagram illustrating a representation of an example of a memory system including a memory device according to an embodiment.

Referring to FIG. 11, a memory controller 3100 may include a SRAM 3110, a CPU 3120, a host interface 3130 (Host I/F), a correction circuit error 3140 (ECC) and a semiconductor interface 3150 (semiconductor I/F) to control the memory device 1110. The SRAM 3110 may be used as a working memory of the CPU 3120. The host interface 3130 may include a data exchange protocol for a host to be coupled to a memory system 3000. An error correction circuit 3140 provided in the memory controller 3100 may detect and correct an error included in the data read from the memory device 1110. The semiconductor interface 3150 may interface with the memory device 1110. The CPU 3120 may perform a control operation for data exchange of the memory controller 3100. In addition, although not illustrated in FIG. 11, the system memory 3000 may include a ROM (not illustrated) for storing code data for interfacing with the host.

The memory controller 3100 may select a memory block or a sub memory block included in the memory device 1110 according to an amount of loaded data, and control the memory device 1110 so that the program operation performs to a selected memory block. For example, information of a main memory block and the sub memory block divided according to a storage capacitance may be stored in SRAM 3110. During the program operation, the CPU 3120 may control the memory device 1110 such that the main memory block or the sub memory block is selected according to a data amount loaded from the host and the memory blocks stored in the SRAM 3110. Alternatively, the CPU 3120 may determine a storage capacitance of the sub memory block according to the loaded data, and control the memory device 1110 so that the program operation performed in a determined sub memory block.

The memory system 3000 according to the present disclosure may be applied to one of a computer, a ultra mobile PC (UMPC), a workstation, a netbook, a PDA, a portable computer, a web tablet, a wireless phone, a mobile phone, a smart phone, a digital camera, a digital audio tape recorder, a digital audio player, a digital video recorder, a digital picture player, a digital video recorder, a digital video player, a device transmitting and receiving information in wireless environment, and various devices that constitute a home network.

Figure 12:
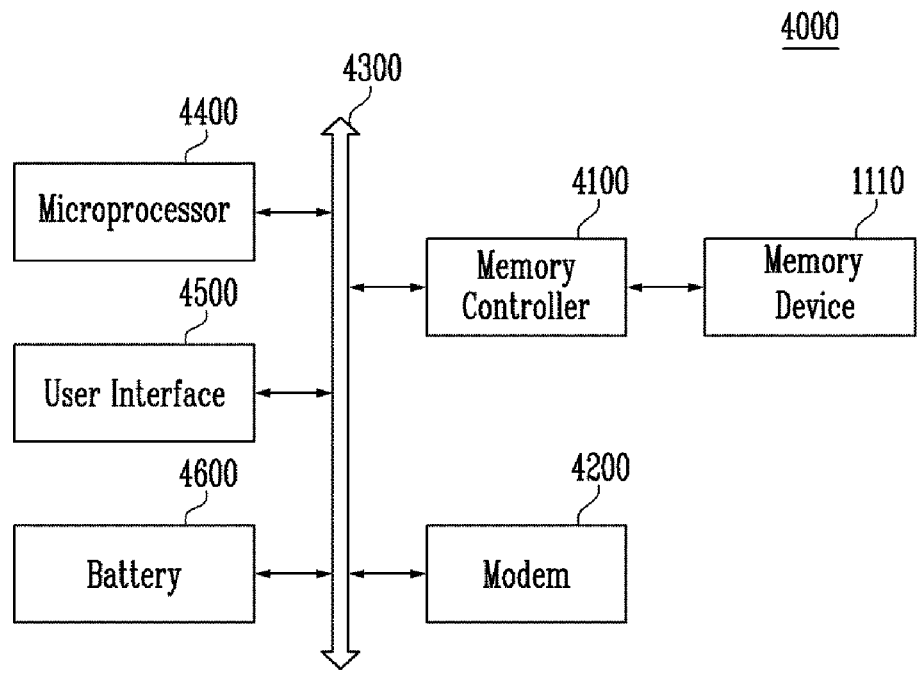
FIG. 12 is a diagram illustrating a representation of an example of a computing system including a memory device according to an embodiment.

FIG. 12 is a diagram illustrating a representation of an example of a computing system including a memory device according to an embodiment.

Referring to FIG. 12, a computing system 4000 according to the present disclosure may include the memory device 1110 electrically coupled to a bus 4300, a memory controller 4100, a modem 4200, and microprocessor 4400 and user interface 4500. When the computing system 4000 according to the present disclosure is a mobile device, a battery 4600 to provide an operating voltage of the computing system 4000 may be additionally provided. Although not illustrated in the drawing, the computing system 4000 according to the present disclosure may include an application chip set, a camera image processor (CIS), a mobile d-ram.

Since the memory device 1110 has the substantially same configuration as FIG. 2, the detailed description of the memory device 1110 will be omitted.

The memory controller 4100 and memory device 1110 may constitute a solid state drive/disk (SSD).

The system according to the present disclosure may be mounted by using various types of packages. For example, the system according to the present disclosure may be mounted by using the packages, for example, a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline (SOIC), a shrink small outline package (SSOP), a thin small outline (TSOP), a system in package (SIP), a multichip package (MCP), a wafer-level fabricated package (WFP) and a wafer-level processed stack package (WSP).

According to the present disclosure, the reliability of sensing operation may be improved by suppressing a current decrease of bit lines during a sensing operation of a memory device.

Examples of embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present disclosure as set forth in the following claims.

What is claimed is:

1. A sensing buffer, comprising:
   a first input circuit coupled between an external power supply and a ground voltage and configured to generate a first current according to a reference voltage;
   a first mirror circuit configured to maintain a predetermined current of a first node according to the first current regardless of the external power supply and a temperature applied to the sensing buffer;
   a second input circuit including a second node coupled to the first node, wherein a predetermined current of a third node is based on a sensing voltage and the current of the first and second nodes; and
   a resistor coupled between the first and second nodes and configured to maintain a predetermined current between the first and second input circuits.

2. The sensing buffer according to claim 1, wherein the first input circuit receives the external power supply through an external power supply terminal and generates a current path such that the first current flows between the external power supply terminal and a ground voltage terminal in response to the reference voltage.

3. The sensing buffer according to claim 1, wherein the second input circuit receives the external power supply and generates a current path between the external power supply and the ground voltage in response to the sensing voltage.

4. The sensing buffer according to claim 1, wherein the first mirror circuit operates in a saturation state such that a predetermined current of the first node flows.

5. The sensing buffer according to claim 1, further comprising:
   a second mirror circuit configured to maintain predetermined currents mirrored in the first mirror circuit.

6. The sensing buffer according to claim 5, further comprising:
   boosting circuits configured for amplifying an amount of an internal current based on a current flowing through the second mirror circuit.

* * * * *